United States Patent
Shi

(10) Patent No.: US 9,853,162 B2
(45) Date of Patent: Dec. 26, 2017

(54) THIN-FILM-TRANSISTOR ARRAY SUBSTRATE, FABRICATING METHOD THEREOF, AND RELATED DISPLAY PANEL

(71) Applicant: BOE TECHNOLOGY GROUP CO., LTD, Beijing (CN)

(72) Inventor: Lei Shi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/107,120

(22) PCT Filed: Dec. 10, 2015

(86) PCT No.: PCT/CN2015/096952
§ 371 (c)(1),
(2) Date: Jun. 22, 2016

(87) PCT Pub. No.: WO2017/016132
PCT Pub. Date: Feb. 2, 2017

(65) Prior Publication Data
US 2017/0207345 A1  Jul. 20, 2017

(30) Foreign Application Priority Data

Jul. 30, 2015  (CN) .......................... 2015 1 0459872

(51) Int. Cl.
*H01L 27/14* (2006.01)
*H01L 29/786* (2006.01)
(Continued)

(52) U.S. Cl.
CPC ...... *H01L 29/78633* (2013.01); *G02F 1/1368* (2013.01); *G02F 1/136209* (2013.01);
(Continued)

(58) Field of Classification Search
CPC ......... H01L 29/78621; H01L 29/78645; H01L 29/78675; H01L 29/78696;
(Continued)

(56) References Cited

U.S. PATENT DOCUMENTS 6,281,552 B1 * 8/2001 Kawasaki ........... H01L 27/1214
257/344
2004/0063270 A1  4/2004 Ishikawa
(Continued)

FOREIGN PATENT DOCUMENTS

CN  1452250 A  10/2003
CN  1567735 A  1/2005
(Continued)

OTHER PUBLICATIONS

State Intellectual Property Office of the P.R.C (SIPO) Office Action 2 for 201510459872.9 dated Sep. 12, 2016 10 Pages.
(Continued)

*Primary Examiner* — Yosef Gebreyesus
(74) *Attorney, Agent, or Firm* — Anova Law Group, PLLC

(57) ABSTRACT

In accordance with some embodiments of the disclosed subject of matter, a TFT array substrate, a method for fabricating the TFT array substrate, and a display panel that comprises the TFT array substrate are provided. In some embodiments, the TFT array substrate comprises: a substrate; an active layer comprising a first region, a source region, a drain region, and a second region between the drain region and the first region; a gate electrode above the first insulating layer, wherein the gate electrode substantially covers the first region; and a first light-shielding layer that overlaps with the first region and substantially covers the second region.

16 Claims, 7 Drawing Sheets

(51) Int. Cl.
*H01L 29/66* (2006.01)
*H01L 27/12* (2006.01)
*G02F 1/1362* (2006.01)
*G02F 1/1368* (2006.01)

(52) U.S. Cl.
CPC ...... *H01L 27/1222* (2013.01); *H01L 27/1274* (2013.01); *H01L 29/66757* (2013.01); *H01L 29/78621* (2013.01); *H01L 29/78645* (2013.01); *H01L 29/78675* (2013.01); *H01L 29/78696* (2013.01)

(58) Field of Classification Search
CPC ........... H01L 29/78633; H01L 27/1222; H01L 27/1274; G02F 1/136209; G02F 1/1368
See application file for complete search history.

(56) References Cited

U.S. PATENT DOCUMENTS

| | | | | |
|---|---|---|---|---|
| 2008/0143664 | A1* | 6/2008 | Nakagawa | G02F 1/1368 345/92 |
| 2008/0299737 | A1 | 12/2008 | Isikawa | |
| 2009/0065783 | A1* | 3/2009 | Moriwaki | G02F 1/136209 257/72 |
| 2011/0175674 | A1* | 7/2011 | Shimizu | H01L 29/78606 327/537 |

FOREIGN PATENT DOCUMENTS

| | | |
|---|---|---|
| CN | 1652349 A | 8/2005 |
| CN | 1971387 A | 5/2007 |
| CN | 1991451 A | 7/2007 |
| CN | 101330047 A | 12/2008 |
| CN | 101388400 A | 3/2009 |
| CN | 103996716 A | 8/2014 |
| JP | 2004200638 A | 7/2004 |
| JP | 2008026774 A | 2/2008 |

OTHER PUBLICATIONS

State Intellectual Property Office of the P.R.C (SIPO) Search Report for 201510459872.9 dated Feb. 4, 2016 10 Pages.

The State Intellectual Property Office of the People's Republic of China (SIPO) Office Action 1 for 201510459872.9 dated May 9, 2016.

The World Intellectual Property Organization (WIPO) International Search Report for PCT/CN2015/096952 dated May 10, 2016.

* cited by examiner

THIN-FILM-TRANSISTOR ARRAY SUBSTRATE, FABRICATING METHOD THEREOF, AND RELATED DISPLAY PANEL

CROSS-REFERENCES TO RELATED APPLICATIONS

This PCT patent application is a national phase entry under 35 U.S.C. §371 of International Application No. PCT/CN2015/096952, filed on Dec. 10, 2015, which claims priority of Chinese Patent Application No. 201510459872.9, filed on Jul. 30, 2015, The above enumerated patent applications are incorporated by reference herein in their entirety.

TECHNICAL FIELD

The disclosed subject matter generally relates to the display technologies and, more particularly, relates to a thin-film-transistor (TFT) array substrate, related fabricating method thereof, and a display panel containing the same.

BACKGROUND

Along with the continuous development of the display technology, as well as the increasing user demand for display devices, thin-film-transistor liquid crystal display (TFT-LCD) technique has been widely used in many products, such as laptop computers, mobile phones, flat-panel monitors, tablet PCs, and so on.

However, in the existing fabricating process, the TFT structure is not fully shielded. Under light exposure, when the TFT structure is in an OFF state, the drain of the reverse biased P-N junction can absorb light energy and thus causes the electron transition. Consequently, governed by the field effect between the source and the drain, the formation of the electron-hole pairs can cause an increasing of the leakage current, which can affect the stability of the TFT.

Accordingly, it is desirable to provide new type of thin-film-transistor (TFT) array substrates, new fabricating method thereof, and related display panels.

BRIEF SUMMARY

In accordance with some embodiments of the disclosed subject matter, a TFT array substrate, a method for fabricating the TFT array substrate, and a display panel that comprises the TFT array substrate are provided.

An aspect of the present disclosure provides a TFT array substrate. In some embodiments, the TFT array substrate comprises: A thin-film-transistor (TFT) array substrate, comprising: a substrate, an active layer comprising a first region, a source region, a drain region, and a second region between the drain region and the first region, a first insulating layer above the active layer, a gate electrode above the first insulating layer, wherein the gate electrode substantially covers the first region, and a first light-shielding layer that overlaps with the first region and substantially covers the second region.

In some embodiments, the first light-shielding layer is connected with the gate electrode through a first via hole.

In some embodiments, the second region is a lightly-doped region, the first region is a non-doped region, the source region and the drain region are both heavily-doped regions.

In some embodiments, the active layer further comprises a third region between the source region and the first region, and the third region is a lightly-doped region.

In some embodiments, the first region is in center of the active layer.

In some embodiments, the thin-film-transistor array substrate further comprises a second light-shielding layer that overlaps with the first region and substantially covers the third region.

In some embodiments, the second light-shielding layer is connected with the gate electrode through a second via hole.

In some embodiments, the first light-shielding layer and the second light-shielding layer are made of a single material in a single process.

In some embodiments, the first light-shielding layer, the second light-shielding layer and the gate electrode are made of a same material.

In some embodiments, the TFT array substrate further comprises a second insulating layer, wherein the second insulating layer is above the gate electrode.

In some embodiments, the TFT array substrate further comprises a third insulating layer that is above the first light-shielding layer.

In some embodiments, the TFT array substrate further comprises a buffer layer that is between the substrate and the active layer.

Another aspect of the present disclosure provides a display panel, incorporating an disclosed TFT array substrate.

Another aspect of the present disclosure includes a method for fabricating a disclosed TFT array substrate, the method comprising: providing a substrate, forming an active layer above the substrate, wherein the active layer comprises a first region, a source region, a drain region, and a second region between the first region and the drain region, forming a first insulating layer above the active layer, forming a gate electrode above the first insulating layer, wherein the gate electrode substantially covers the first region, and forming a first light-shielding layer that overlaps with the first region and substantially covers the second region.

In some embodiments, the first region is in center of the active layer.

In some embodiments, the method further comprises forming a second light-shielding layer that overlaps with the first region and substantially covers a third region between the source region and the first region.

In some embodiments, the process for forming the first light-shielding layer comprises: forming a first via hole on the first insulating layer; forming a metal layer on the first insulating layer; and forming the first light-shielding layer by patterning the metal layer, wherein the first light-shielding layer is connected with the first gate electrode through the first via hole.

In some embodiments, the process for forming the second light-shielding layer comprises: forming a second via hole on the first insulating layer; forming a metal layer on the first insulating layer; and forming the second light-shielding layer by patterning the metal layer, wherein the second light-shielding layer is connected with the first gate electrode through the second via hole.

In some embodiments, the method further comprises forming a second insulating layer and a third insulating layer, wherein the second insulating layer is above the gate electrode, and the third insulating layer is above the first light-shielding layer.

In some embodiments, the method further comprises forming a buffer layer between the substrate and the active layer.

Other aspects of the present disclosure can be understood by those skilled in the art in light of the description, the claims, and the drawings of the present disclosure.

BRIEF DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like elements. It should be noted that the following drawings are merely examples for illustrative purposes according to various disclosed embodiments and are not intended to limit the scope of the present disclosure.

DETAILED DESCRIPTION

For those skilled in the art to better understand the technical solution of the disclosed subject matter, reference will now be made in detail to exemplary embodiments of the disclosed subject matter, which are illustrated in the accompanying drawings. Wherever possible, the same reference numbers will be used throughout the drawings to refer to the same or like parts.

In accordance with various embodiments, the disclosed subject matter provides a TFT array substrate, a method for fabricating the TFT array substrate, and a display panel that comprises the TFT array substrate.

In accordance with various embodiments, the disclosed subject matter provides a TFT array substrate. The TFT array substrate comprises: a substrate; an active layer comprising a non-doped region, two lightly-doped regions, a source region and a drain region; a first insulating layer and a second insulating layer; a first gate electrode; a source electrode that is connected with the source region, wherein the source electrode penetrates through the first and the second insulating layers; a drain electrode that is connected with the drain region, wherein the drain electrode penetrates through the first and the second insulating layers; a first light-shielding layer that overlaps a portion of the non-doped region and one lightly-doped region.

It should be noted that, in the LDD structure, the lightly-doped region next to drain can carry a part of the voltage between the source and drain, so that the effects of hot-electron degradation can be prevented. Further, when TFT array substrate is exposed under the light, the first light-shielding layer can block the light and cover the one lightly-doped region between the non-doped region and the drain region. As such, embodiments of the present disclosure resolve the problem of increased leakage current due to the light leakage in lightly-doped region and enhance the stability of the TFT array substrate.

Figure 1:
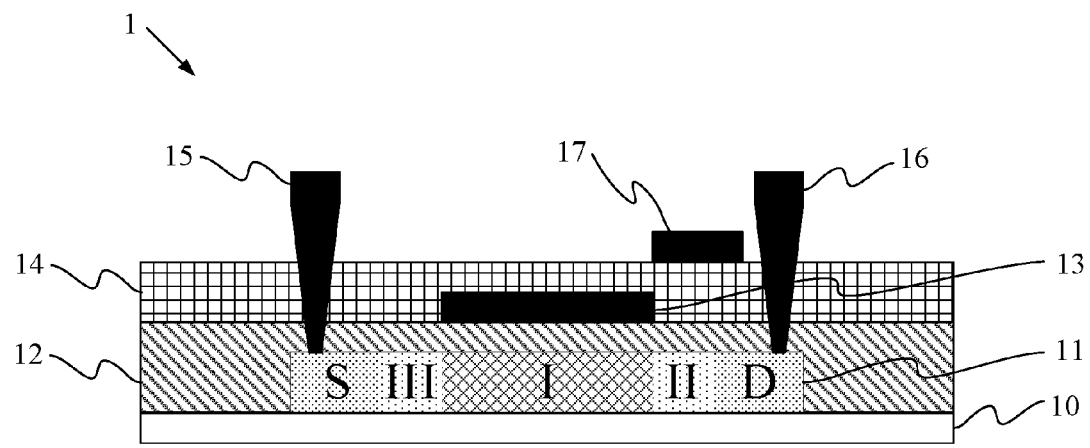
FIG. 1 is a schematic structural sectional view of an exemplary TFT array substrate in accordance with some embodiments of the disclosed subject matter.

Turning to FIG. 1, a schematic structural sectional view of an exemplary TFT array substrate is shown in accordance with some embodiments of the disclosed subject matter. As illustrated, in some embodiments, TFT array substrate 1 includes substrate 10, active layer 11, first insulating layer 12, first gate electrode 13, second insulating layer 14, source 15, drain 16, and first light-shielding layer 17.

As referred to herein, substrate 10 can be any suitable substrate. For example, substrate 10 can be made of any suitable material or combination of materials, such as glass, transparent resin material, etc. As another example, substrate 10 can be a substrate covered by one or more thin film layers.

In some embodiments, active layer 11 is located above substrate 10, and includes a first region I, a second region II, a third region III, source region S, and drain region D. In some embodiments, the first region I, the second region II, and the third region III can be doped using any suitable concentration. For example, the first region I is a non-doped region, the second region II and the third region III are two lightly-doped regions.

As illustrated in FIG. 1, in some embodiments, first region I is located in the center, second region II is located between first region I and drain region D, third region III is located between first region I and source region S.

In some embodiments, first insulating layer 12 is located above active layer 11 and substantially fully encases active layer 11. In some embodiments, first gate electrode 13 is located above first insulating layer 12 and overlaps with the first region I. In some embodiments, second insulating layer 14 is located above first gate electrode 13 and substantially fully encases first gate electrode 13. It should be noted that, first insulating layer 12 and second insulating layer 14 can be made of any suitable material or combination of materials.

In some embodiments, as illustrated in FIG. 1, source electrode 15 is located above and connected with source region S, while drain electrode 16 is located above and connected with drain region D. In some embodiments, both source electrode 15 and drain electrode 16 penetrate through first insulating layer 12 and second insulating layer 14.

In some embodiments, first light-shielding layer 17 overlaps a portion of the first region I and substantially covers second region II. It should be noted that, first light-shielding layer 17 can be made of any suitable material or combinations of materials.

Figure 2:
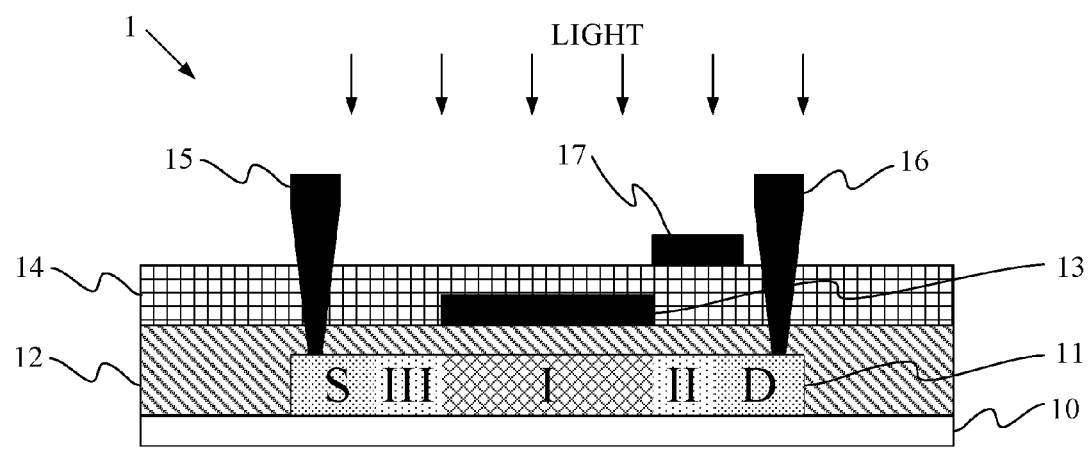
FIG. 2 is a schematic structural sectional view of the exemplary TFT array substrate shown in FIG. 1 under light exposure in accordance with some embodiments of the disclosed subject matter.

Turning to FIG. 2, a schematic structural sectional view of the TFT array substrate shown in FIG. 1 under light exposure is shown in accordance with some embodiments of the disclosed subject matter.

The lightly-doped drain (LDD) structure is often used in order to avoid the leakage current between the source and drain, which may be caused by the shortening of the length of TFT channel. Normally, in the LDD structure, a low-concentration impurity doped LDD region (e.g., second II or third region III) is formed to expand the length of the TFT channel. Specifically, a LDD structure can be formed by using two steps of doping processes with different iron concentrations. For example, a heavily doping process can form source region S and drain region D, while a lightly doping process can form the LDD region. Since source region S is connected with source electrode 15 and drain region D is connected with drain electrode 16, the leakage current between the source and drain can unexpectedly increase due to the leakage of the incident light in the uncovered LDD region.

It should be noted that, in the LDD structure, second region II can carry a part of the voltage between the source and drain, so that the effects of hot-electron degradation can be prevented.

In some embodiments, as described in accordance with FIG. 1, first light-shielding layer 17 overlaps a portion of first region I and substantially covers second region II. Therefore, as shown in FIG. 2, when TFT array substrate 1 is exposed under the light, first light-shielding layer 17 can block the light and substantially covers second region II. Consequently, the problem of increased leakage current due to the light leakage in second region II can be avoided, and the stability of TFT array substrate 1 can be thereby enhanced.

Figure 3:
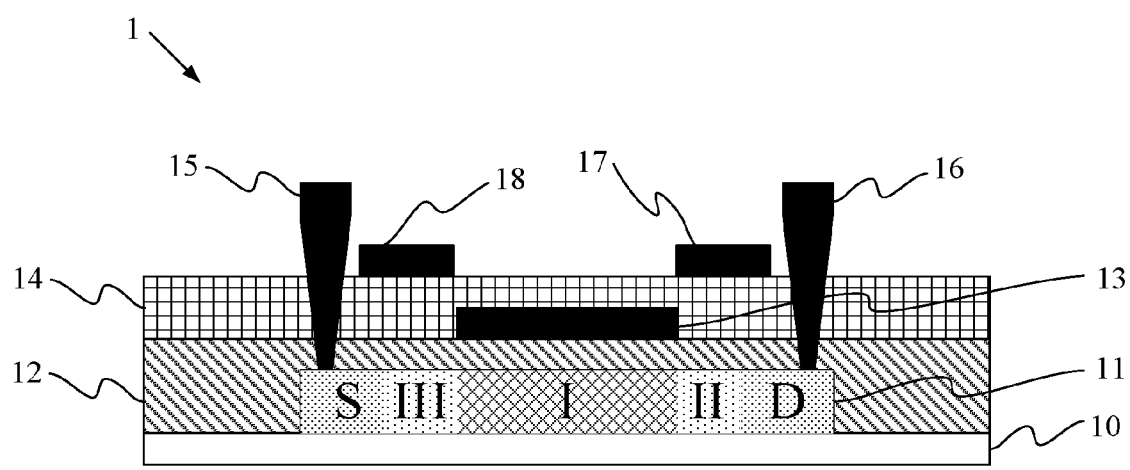
FIG. 3 is a schematic structural sectional view of an exemplary TFT array substrate in accordance with some embodiments of the disclosed subject matter.

Turing to FIG. 3, a schematic structural sectional view of a second exemplary TFT array substrate is shown in accordance with some embodiments of the disclosed subject matter. As illustrated, besides substrate 10, active layer 11, first insulating layer 12, first gate electrode 13, second insulating layer 14, source 15, drain 16, and first light-shielding layer 17, TFT array substrate 1 further comprises second light-shielding layer 18, which is located above second insulating layer 14. In some embodiments, second light-shielding layer 18 overlaps a portion of first region I and substantially covers third region III. It should be noted that, second light-shielding layer 18 can be made of any suitable material or combination of materials.

Figure 4:
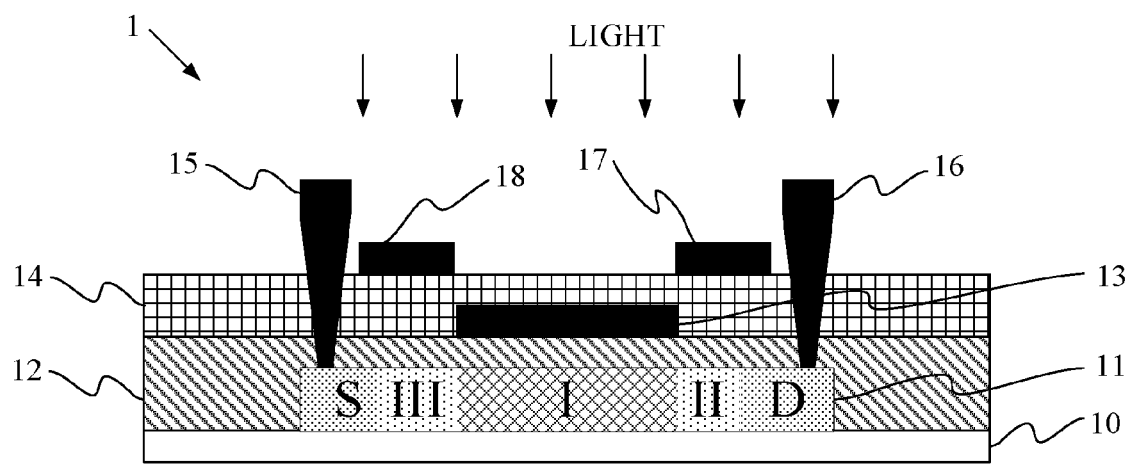
FIG. 4 is a schematic structural sectional view of the exemplary TFT array substrate shown in FIG. 3 under light exposure in accordance with some embodiments of the disclosed subject matter.

Turing to FIG. 4, a schematic structural sectional view of the TFT array substrate shown in FIG. 3 under light exposure is shown in accordance with some embodiments of the disclosed subject matter. Since second light-shielding layer 18 overlaps a portion of first region I and substantially covers third region III, when TFT array substrate 1 is exposed under the light as illustrated in FIG. 4, second light-shielding layer 18 can block the light and cover third region III. Consequently, the problem of increased leakage current due to the light leakage in third region III can be further avoided, and the stability of TFT array substrate 1 can be thereby further enhanced.

Figure 5:
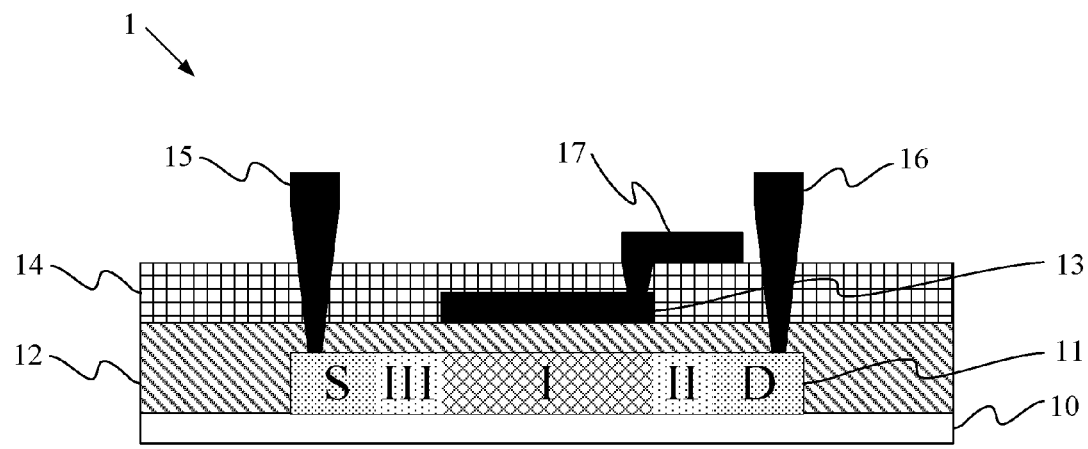
FIG. 5 is a schematic structural sectional view of an exemplary TFT array substrate, wherein a first light-shielding layer is a second gate, in accordance with some embodiments of the disclosed subject matter.

FIG. 5 is a schematic structural sectional view of a third exemplary TFT array substrate in accordance with some embodiments of the disclosed subject matter. As illustrated, first light-shielding layer 17 overlaps a portion of region I and substantially covers second region II.

In some embodiments, first light-shielding layer 17 is a second gate electrode. In some embodiments, first light-shielding layer 17 can be made of the same materials (e.g., metal materials) as those of first gate electrode 13. In some embodiments, first light-shielding layer 17 is connected to first gate electrode 13 through a via hole. So that first light-shielding layer 17 is equipotential with first gate electrode 13, and is electrically synchronized with first gate electrode 13.

Figure 6:
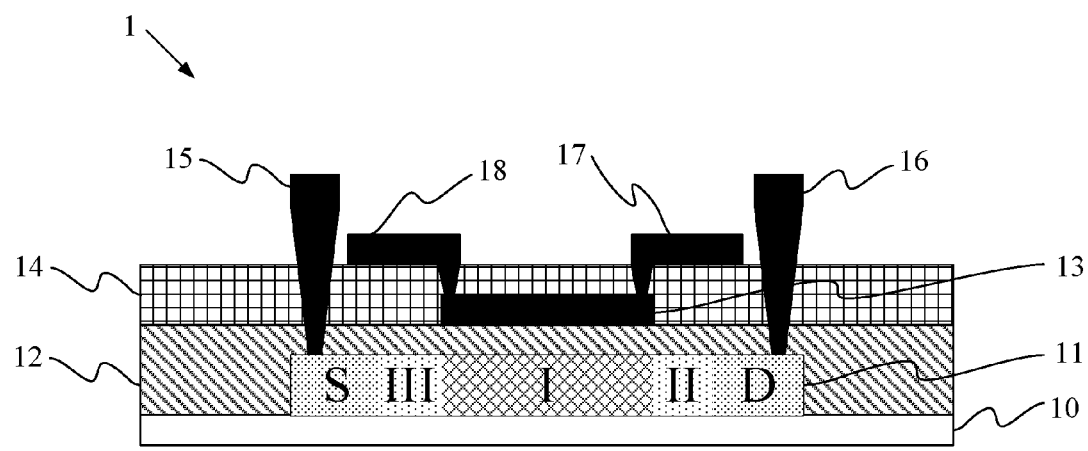
FIG. 6 is a schematic structural sectional view of an exemplary TFT array substrate, wherein a first light-shielding layer is the second gate and a second light-shielding layer is a third gate, in accordance with some embodiments of the disclosed subject matter.

FIG. 6 is a schematic structural sectional view of a fourth exemplary TFT array substrate in accordance with some embodiments of the disclosed subject matter. As illustrated, first light-shielding layer 17 overlaps a portion of region I and substantially covers second region II, and second light shielding layer 18 overlaps a portion of region I and substantially covers third region III.

In some embodiments, first light-shielding layer 17 is a second gate electrode, and second light-shielding layer 18 is a third gate electrode. In some embodiments, first light-shielding layer 17 and second light-shielding layer 18 can be made of the same materials (e.g., metal materials) as those of first gate electrode 13. In some embodiments, first light-shielding layer 17 and second light-shielding layer 18 are connected to first gate electrode 13 through two via holes. So that first light-shielding layer 17 and second light-shielding layer 18 are equipotential with first gate electrode 13, and are electrically synchronized with first gate electrode 13.

Figure 7:
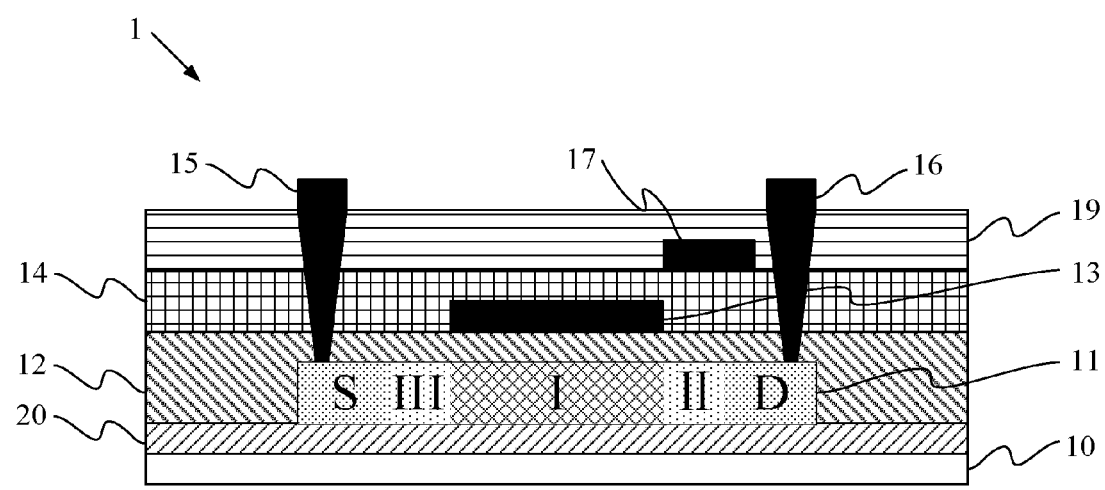
FIG. 7 is a schematic structural sectional view of an exemplary TFT array substrate including a third insulating layer in accordance with some embodiments of the disclosed subject matter.

FIG. 7 is a schematic structural sectional view of a fifth exemplary TFT array substrate in accordance with some embodiments of the disclosed subject matter. As illustrated, TFT array substrate 1 can further comprise third insulating layer 19, and buffer layer 20.

In some embodiment, third insulating layer 19 is located above first light-shielding layer 17 and substantially fully encases first light-shielding layer 17. Although it is not shown in FIG. 7, it should be noted that, if TFT array substrate 1 further comprises second light-shielding layer 18 which is in accordance with FIGS. 3, 4, and 6, third insulating layer 19 is then located above and substantially fully covers both first light-shielding layer 17 and second light-shielding layer 18.

In some embodiments, for preventing contaminants entering active layer 11 from substrate 10, buffer layer 20 is formed between substrate 10 and active layer 11.

It also should be noted that, in some embodiments that are not shown in the above figures, if there is no distinction between source and drain in the structure of TFT array substrate 1, both first light-shielding layer 17 and second light-shielding layer 18 should be included in TFT array substrate 1.

In accordance with various embodiments, the disclosed subject matter provides a method for fabricating a TFT array substrate described above. The method comprises: forming a polysilicon layer above the substrate; forming a first insulating layer above the polysilicon layer; forming a first gate electrode above the first insulating layer; forming an active layer, wherein the active layer comprises a non-doped region, two lightly-doped regions, a source region and a drain region; forming a second insulating layer above the first gate electrode; forming a source electrode that is connected with the source region; forming a drain electrode that is connected with the drain region; wherein the source electrode and the drain electrode penetrate through the first insulating layer and the second insulating layer. The method further comprises forming a first light-shielding layer above the second insulating layer, wherein the first light-shielding layer overlaps a portion of the non-doped region and one lightly-doped region.

It should be noted that, in the LDD structure, the lightly-doped region next to drain can carry a part of the voltage between the source and drain, so that the effects of hot-electron degradation can be prevented. Further, when TFT array substrate is exposed under the light, the first light-shielding layer can block the light and cover the one lightly-doped region between the non-doped region and the drain region. As such, embodiments of the present disclosure resolve the problem of increased leakage current due to the light leakage in lightly-doped region and enhance the stability of the TFT array substrate.

Figure 8:
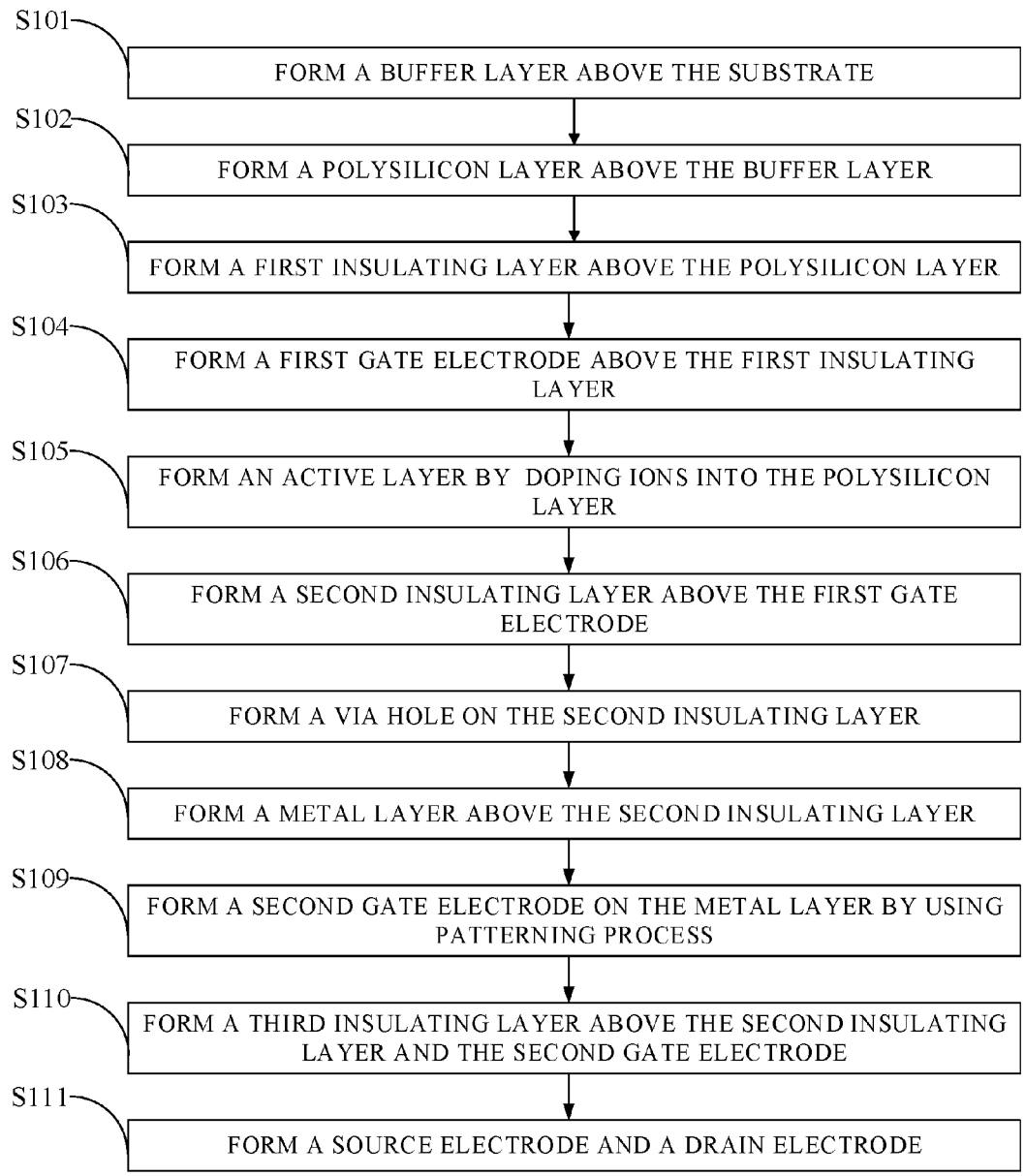
FIG. 8 shows an exemplary method for fabricating the exemplary TFT array substrate in accordance with some embodiments of the disclosed subject matter.

Turing to FIG. 8, an example of method for fabricating process of the third example of TFT array substrate is shown in accordance with some embodiments of the disclosed subject matter. As described above in accordance with FIG. 5, the third example of TFT array substrate comprises a first light-shielding layer that is the second gate electrode.

At S101, the method can start with providing an buffer layer above the substrate. The substrate can be made of any suitable material or combination of materials, such as glass, transparent resin material, etc. In some embodiments, the substrate can be coated with one or more thin film layers. In some embodiments, the substrate need to be pre-cleaned before starting process S101.

In some embodiments, a buffer layer can be formed between the substrate and an active layer in order to block the impurities diffusing from the substrate into the active layer. So that the harmful impact on the threshold voltage and the leakage current characteristics of the TFT structure can be prevented by the buffer layer.

The buffer layer can be formed using any suitable deposition techniques such as physical vapor deposition, chemical vapor deposition, electrochemical deposition, molecular beam epitaxy, atomic layer deposition, laser deposition, etc. Specifically, Plasma Enhanced Chemical Vapor Deposition (PECVD), Low Pressure Chemical Vapor Deposition (LP-CVD), Atmospheric Pressure Chemical Vapor Deposition (APCVD), Electron Cyclotron Resonance-Chemical Vapor Deposition (ECR-CVD) or physical vapor deposition (e.g., evaporation, sputtering, etc.) can be used to form the buffer layer.

Any suitable material or combination of materials can be used to form the buffer layer. For example, the material can be silicon oxide and/or silicon nitride. In some embodiments, the buffer layer can be a single layer of silicon oxide, a single layer of silicon nitride, a laminate of both silicon oxide layer and silicon nitride layer, or a mixture of both materials with certain proportions.

In some embodiments, the thickness of the buffer layer can be in the range of 300 angstroms to 10,000 angstroms. Optionally, the thickness of the buffer layer may be in the range of 500 Angstroms to 4,000 Angstroms. In some embodiments, the buffer layer is deposited at a temperature substantially equal to or lower than 600° C.

It should be noted that, in conventional alkaline glasses, the concentration of metal impurities (e.g., aluminum, barium, sodium, etc.) is at a high level. In order to avoid the diffusion of metal impurities in high temperature treatment processes, an optional choice of the substrate can be an alkali-free glass substrate.

Figure 9:
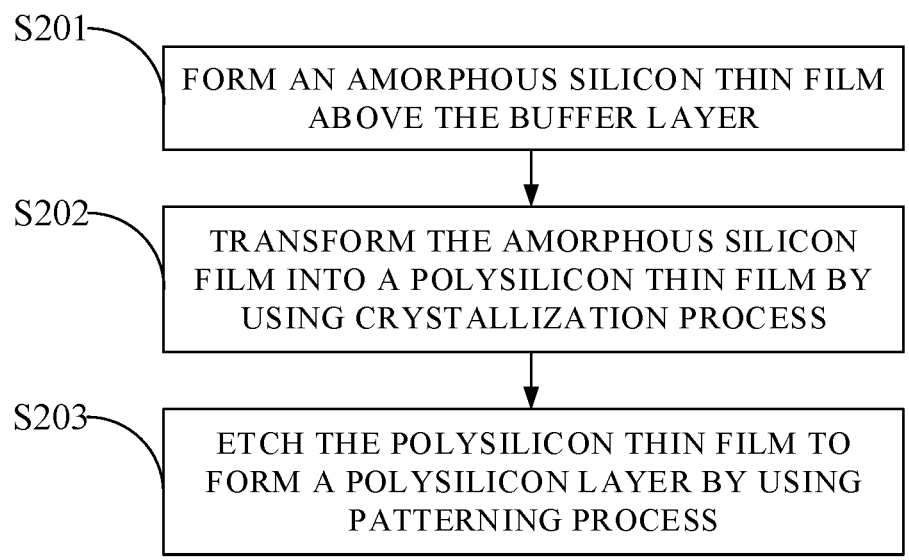
FIG. 9 shows an exemplary method for forming a polysilicon layer above a buffer layer in accordance with some embodiments of the disclosed subject matter.

At S102, a polysilicon layer can be formed above the buffer layer. A detailed example of a method for forming a polysilicon layer on a buffer layer is shown in FIG. 9. The method includes S201-S203:

At S201, an amorphous silicon thin film can be formed above the buffer layer. The amorphous silicon thin film can be formed above the buffer layer by using any suitable deposition technique, such as PECVD, LPCVD, APCVD, ECR-CVD, or sputtering, etc. In some embodiments, the amorphous silicon film is deposited at a temperature substantially equal to or lower than 600° C.

At S202, the amorphous silicon film can be transformed into a polysilicon film using crystallization process. Any suitable crystallization technique, such as solid phase crystallization technique, excimer laser crystallization technique, metals induced crystallization technique, or any combination thereof, can be used for transforming the amorphous silicon film into the polysilicon film.

It should be noted that, the TFT fabrication process would be different if using different crystallization processes. In some embodiments, depending on the specific circumstances, one or more steps (e.g., dehydrogenation heat treatment, inducing metal deposition, crystallization heat treatment, doping in source and drain regions, doped impurity activation, etc.) can be added to the process. In the present disclosure, doping in source and drain regions and doped impurity activation are described in various embodiments. This, however, should not limit the fabrication processes used in embodiments of the present disclosure.

At S203, using the patterning process, the polysilicon film can be etched to form a polysilicon layer. The polysilicon film can be etched using any suitable etching technique, such as plasma etching, reactive ion etching, inductively coupled plasma etching, and other suitable dry etching method. In some embodiments, the etching gas can be a mixture gas containing fluorine, and/or chlorine, such as $CF_4$, $CHF_3$, $SF_6$, $CCl_2F_2$. The etching gas can also be a mixture of any of the above gas that is mixed with $O_2$.

Referring back to FIG. 8, after the polysilicon layer is formed at S102, a first insulating layer is formed on the polysilicon layer at S103. In some embodiments, the first insulating layer is deposited above the polysilicon layer by using any suitable deposition technique, such as PECVD, LPCVD, APCVD, ECR-CVD, or sputtering, etc. In some embodiments, the first insulating layer can be a material of single layer of silicon oxide, a single layer of silicon nitride, a laminate of both silicon oxide layer and silicon nitride layer, or a mixture of both materials with certain proportions.

At S104, a first gate electrode can be formed above the first insulating layer. In some embodiments, the steps of forming the first gate electrode can comprise: depositing a metal layer above the first insulating layer, patterning the metal layer, and etching the metal layer.

At S105, using ion implantation process, an active layer can be formed by doping ions into the polysilicon layer. In some embodiments, a P-type ion doping is implemented on the polycrystalline silicon layer, wherein the P-type ion doping comprising the following steps: after forming the first gate electrode above the first insulating layer, reserving the photoresist on the first gate electrode; doping heavily concentrated P-type ions into the polysilicon layer; removing the photoresist on the first gate; doping lightly concentrated P-type ions into the polysilicon layer.

In some embodiments, the formed active layer comprises a first region, a second region, a third region, a source region, and a drain region. The first region can be a non-doped region located in center of active layer. The second region is a lightly-doped region that is located between the first region and the drain region. The third region is a lightly-doped region that is located between the first region and the source region.

In some embodiments, using the above-described P-type ion doping method, a LDD structure can be formed in the active layer. For example, a lightly-doped region can be formed next to the drain region in the channel. Since the lightly-doped region can carry a part of the voltage between source and drain, the hot electron degradation effects can be prevented.

In some embodiments, any suitable ion implantation technique can be implemented in the above-described ion doping process. For example, an ion implantation process can be implemented with or without mass analyzer. As another example, plasma implantation technique, or solid state diffusion implantation technique can be used for doping P-type ions.

In some embodiments, a gas that contains boron and/or phosphorus can be used during the ion implantation process. For example, diborane gas ($B_2H_6$) can be used in the ion implantation process. In some embodiments, mixed gas that contains 5%-15% weight ratio of $B_2H_6$ and 85%-95% weight ratio of $H_2$ can be used as the injected gas.

In some embodiments, an ion implantation energy is between 10 keV and 200 keV. Optionally, the ion implantation energy is between 40 keV and 100 keV.

In some embodiments, the implemented ion dose is between $1\times1011$ and $1\times1020$ per cubic centimeter. Optionally, the implemented ion dose is between $1\times1013$ and $8\times1015$ per cubic centimeter.

At S106, a second insulating layer can be formed above the first gate electrode. In some embodiments, the second insulating layer is deposited above the first gate electrode by using any suitable deposition technique, such as PECVD, LPCVD, APCVD, ECR-CVD, or sputtering, etc. In some embodiments, the second insulating layer can be a material of single layer of silicon oxide, a single layer of silicon nitride, a laminate of both silicon oxide layer and silicon nitride layer, or a mixture of both materials with certain proportions.

At S107, a via hole can be formed on the second insulating layer. The via hole can be etched using any suitable etching techniques, such as plasma etching, reactive ion etching, inductively coupled plasma etching, and other suitable dry etching methods. In some embodiments, the etching gas can be a mixture gas containing fluorine, and/or chlorine, such as $CF_4$, $CHF_3$, $SF_6$, $CC_{12}F_2$. The etching gas can also be a mixture of any of the above gas that is mixed with $O_2$.

At S108, a metal layer can be formed above the second insulating layer.

At 5109, a second gate electrode can be formed on the metal layer using the patterning process. In some embodiments, the second gate electrode is made of the same material that is made for the first gate electrode. In some embodiments, the second gate electrode is connected with the first gate electrode through the via hole. In some embodiments, the second gate electrode overlaps a portion of the first region and substantially covers the second region.

At S110, a third insulating layer can be formed above the second insulating layer and the second gate electrode. In some embodiments, the third insulating layer can be formed using any suitable deposition technique, such as PECVD, LPCVD, APCVD, ECR-CVD, or sputtering, etc.

At S111, a source electrode and a drain electrode can be formed, wherein the source electrode is connected with the source region, and the drain region is connected with the drain region. In some embodiments, a method for forming the source electrode and the drain electrode can comprise: etching two via holes through the second and third insulating layers; depositing a metal layer above the third insulating layer; patterning the metal layer; and etching the metal layer to form the source electrode and the drain electrode.

Figure 10:
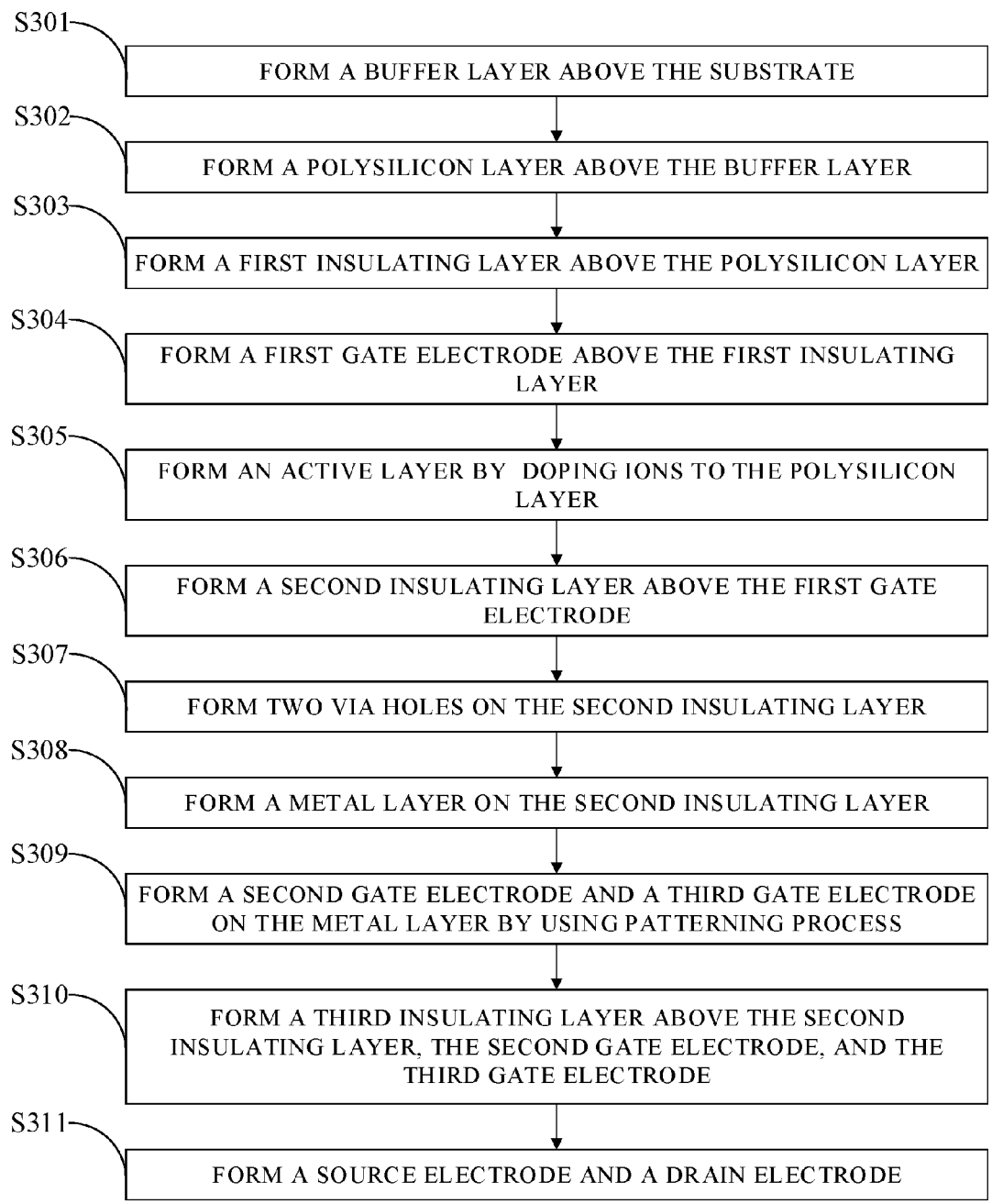
FIG. 10 shows an exemplary method for fabricating the exemplary TFT array substrate in accordance with some embodiments of the disclosed subject matter.

Turning to FIG. 10, an example of a method for fabricating the fourth exemplary TFT array substrate is shown in accordance with some embodiments of the disclosed subject matter. As described above in accordance with FIG. 6, the fourth example of TFT array substrate comprises a first light-shielding layer and a second light-shielding layer. Further, the first light-shielding layer is the second gate electrode, and the second light-shielding layer is the third gate electrode.

As illustrated, steps S301-S306 are the same steps S101-S106 that described above in accordance with FIG. 8.

At S307, two via holes can be formed on the second insulating layer. The two via holes can be etched using any suitable etching technique, such as plasma etching, reactive ion etching, inductively coupled plasma etching, and other suitable dry etching methods. In some embodiments, the etching gas can be a mixture gas containing fluorine, and/or chlorine, such as $CF_4$, $CHF_3$, $SF_6$, $CCl_2F_2$. The etching gas can also be a mixture of any of the above gas that is mixed with $O_2$.

At S308, a metal layer can be formed above the second insulating layer.

At S309, a second gate electrode and a third gate electrode can be formed on the metal layer using the patterning process. In some embodiments, the second gate electrode and the third gate electrode are made of the same material that is made for the first gate electrode. In some embodiments, the second gate electrode is connected with the first gate electrode through one via hole, and the third gate electrode is connected with the first gate electrode through the other via hole. In some embodiments, the second gate electrode overlaps a portion of the first region and substantially covers the second region, and the third gate electrode overlaps a portion of the first region and substantially covers the third region.

At S310, a third insulating layer can be formed above the second insulating layer as well as the second gate electrode and the third gate electrode. In some embodiments, the third insulating layer can be formed using any suitable deposition technique, such as PECVD, LPCVD, APCVD, ECR-CVD, or sputtering, etc.

At S311, a source electrode and a drain electrode can be formed, wherein the source electrode is connected with the source region, and the drain region is connected with the drain region. In some embodiments, a method for forming the source electrode and the drain electrode can comprise: etching two via holes through the second and third insulating layers; depositing a metal layer above the third insulating layer; patterning the metal layer; and etching the metal lay to form the source electrode and the drain electrode.

In accordance with various embodiments, the disclosed subject matter provides a display panel that comprises any of the TFT array substrate disclosed above. Specifically, the disclosed display panel comprises a TFT array substrate that comprises: a substrate; an active layer comprising a non-doped region, two lightly-doped regions, a source region and a drain region; a first insulating layer and a second insulating layer; a first gate electrode; a source electrode that is connected with the source region, wherein the source electrode penetrates through the first and the second insulating layers; a drain electrode that is connected with the drain region, wherein the drain electrode penetrates through the first and the second insulating layers; a first light-shielding layer that overlaps a portion of the non-doped region and one lightly-doped region.

In the LDD structure, the lightly-doped region next to drain can carry a part of the voltage between the source and drain, so that the effects of hot-electron degradation can be prevented. Further, when TFT array substrate is exposed under the light, the first light-shielding layer can block the light and cover the one lightly-doped region between the non-doped region and the drain region. As such, embodiments of the present disclosure resolve the problem of increased leakage current due to the light leakage in lightly-doped region and enhance the stability of the TFT array substrate.

The provision of the examples described herein (as well as clauses phrased as "such as," "e.g.," "including," and the like) should not be interpreted as limiting the claimed subject matter to the specific examples; rather, the examples are intended to illustrate only some of many possible aspects. It should also be noted that the words, clauses, and/or phrased of directions and positions used herein (such as "above," "on," and the like) should not be interpreted as limiting the claimed subject matter to absolute directions or positions; rather, these are intended to illustrate only some of many possible relative directions or positions.

Accordingly, a TFT array substrate, a method for fabricating the TFT array substrate, and a display panel that comprises the TFT array substrate are provided.

Although the disclosed subject matter has been described and illustrated in the foregoing illustrative embodiments, it is understood that the present disclosure has been made only by way of example, and that numerous changes in the details of embodiment of the disclosed subject matter can be made without departing from the spirit and scope of the disclosed subject matter, which is only limited by the claims which follow. Features of the disclosed embodiments can be combined and rearranged in various ways. Without departing from the spirit and scope of the disclosed subject matter, modifications, equivalents, or improvements to the disclosed subject matter are understandable to those skilled in the art and are intended to be encompassed within the scope of the present disclosure.

What is claimed is:

1. A thin-film-transistor array substrate, comprising:
   a substrate;
   an active layer above the substrate comprising a first region, a source region, a drain region, and
   a second region between the drain region and the first region;
   a first insulating layer above the active layer;
   a gate electrode above the first insulating layer, wherein the gate electrode substantially covers the first region; and
   a first light-shielding layer that:
      overlaps with a portion of the first region without covering other portions of the first region,
      substantially covers the second region, and
      is insulated from the gate electrode.

2. The thin-film-transistor array substrate of claim 1, wherein the second region is a lightly-doped region, the first region is a non-doped region, the source region and the drain region are both heavily-doped regions.

3. The thin-film-transistor array substrate of claim 1, wherein the active layer further comprises a third region between the source region and the first region, and the third region is a lightly-doped region.

4. The thin-film-transistor array substrate of claim 3, wherein the first region is in center of the active layer.

5. The thin-film-transistor array substrate of claim 3, further comprising a second light-shielding layer that overlaps with the first region and substantially covers the third region.

6. The thin-film-transistor array substrate of claim 5, wherein the first light-shielding layer and the second light-shielding layer are made of a single material in a single process.

7. The thin-film-transistor array substrate of claim 6, wherein the first light-shielding layer, the second light-shielding layer and the gate electrode are made of a same material.

8. The thin-film-transistor array substrate of claim 1, further comprising a second insulating layer that is above the gate electrode.

9. The thin-film-transistor array substrate of claim 8, further comprising a third insulating layer that is above the first light-shielding layer.

10. The thin-film-transistor array substrate of claim 1, further comprising a buffer layer between the substrate and the active layer.

11. A display panel, comprising the thin-film-transistor array substrate according to claim 1.

12. A method for fabricating a thin-film-transistor array substrate, the method comprising:
   providing a substrate;
   forming an active layer above the substrate, wherein the active layer comprises a first region, a source region, a drain region, and a second region between the first region and the drain region;
   forming a first insulating layer above the active layer;
   forming a gate electrode above the first insulating layer, wherein the gate electrode substantially covers the first region; and
   forming a first light-shielding layer that:
      overlaps with a portion of the first region without covering other portions of the first region,
      substantially covers the second region, and
      is insulated from the gate electrode.

13. The method for fabricating a thin-film-transistor array substrate of claim 12, wherein the first region is in center of the active layer.

14. The method for fabricating a thin-film-transistor array substrate of claim 12, further comprising forming a second light-shielding layer that overlaps with the first region and substantially covers a third region between the source region and the first region.

15. The method for fabricating a thin-film-transistor array substrate of claim 12, further comprising forming a second insulating layer and a third insulating layer, wherein the second insulating layer is above the gate electrode, and the third insulating layer is above the first light-shielding layer.

16. The method for fabricating a thin-film-transistor array substrate according to claim 12, further comprising forming a buffer layer between the substrate and the active layer.

* * * * *